[54] SEMICONDUCTOR PACKAGE

[75] Inventor: Toshikazu Ogata, Itami, Japan

[73] Assignee: Mitsubishi Denki Kabushiki Kaisha, Tokyo, Japan

[21] Appl. No.: 584,092

[22] Filed: Sep. 18, 1990

[30] Foreign Application Priority Data

Feb. 19, 1990 [JP] Japan ................................ 2-36189

[51] Int. Cl.$^5$ .............................................. B32B 15/04
[52] U.S. Cl. .................................... 428/620; 428/621; 428/632
[58] Field of Search ............... 428/620, 621, 627, 632, 428/633, 641, 674, 675, 652, 672; 228/123, 124

[56] References Cited

U.S. PATENT DOCUMENTS

| | | | |
|---|---|---|---|
| 3,159,462 | 12/1964 | Kadelburg | 428/620 |
| 3,166,449 | 1/1965 | Finn et al. | 428/620 |
| 3,331,996 | 7/1967 | Green | 428/620 |
| 3,597,658 | 8/1971 | Rivera | 428/620 |
| 3,600,144 | 8/1971 | Csakvary | 428/620 |
| 4,078,711 | 3/1978 | Bell et al. | 228/123 |
| 4,610,434 | 9/1986 | Boecker et al. | 228/124 |
| 4,886,704 | 12/1989 | Sasame et al. | 428/620 |

FOREIGN PATENT DOCUMENTS 0243637 11/1987 European Pat. Off.
2051474 1/1981 United Kingdom.

Primary Examiner—John J. Zimmerman
Attorney, Agent, or Firm—Leydig, Voit & Mayer

[57] ABSTRACT

A semiconductor package in which a ceramic substrate is joined to a copper stud by brazing. Between the substrate and the stud, first and second members are each fixed in place with a brazing material. The first member has a thermal expansion coefficient intermediate those of the copper stud and the ceramic substrate for reducing the thermal stress generated in the ceramic substrate. The second member prevents the ceramic substrate from being deformed by thermal stress. If the first member is, e.g., a Cu-W alloy used as the neck on the copper stud, it is possible to reduce the compressive stress generated in the ceramic substrate during cooling after the brazing. Further, the influence on the substrate by bimetallic deformation as a result of the combination of the copper stud and the Cu-W alloy is mitigated by a flexible second member, e.g., a copper foil. Thus, the ceramic substrate is brazed without involving any substantial stress thereon.

10 Claims, 1 Drawing Sheet

FIG. I
PRIOR ART
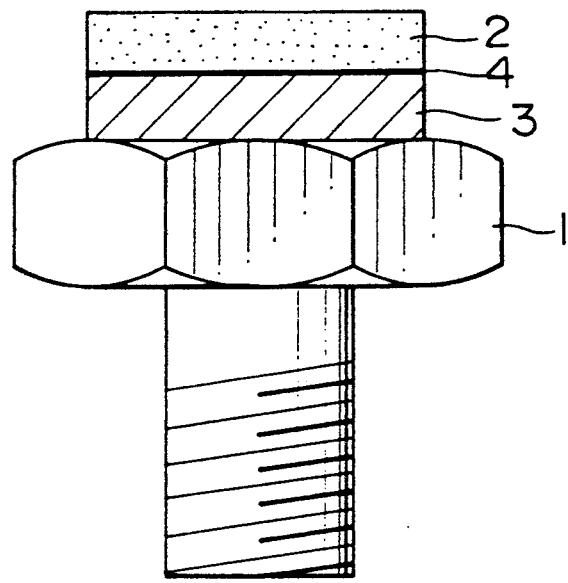
FIG. 2
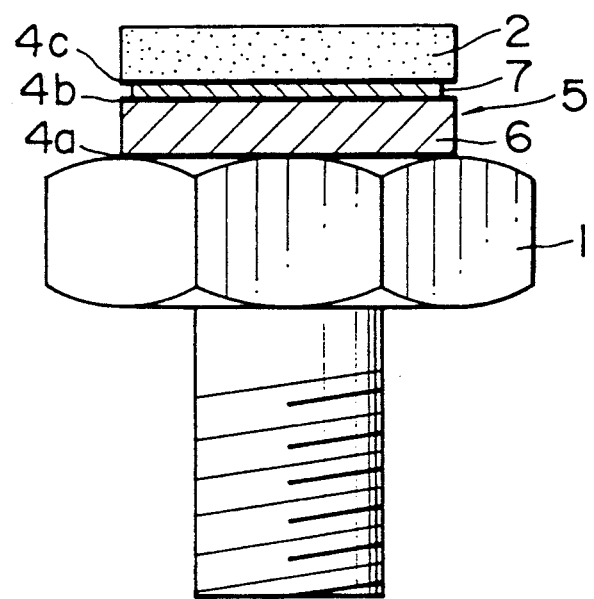

SEMICONDUCTOR PACKAGE

BACKGROUND OF THE INVENTION

1. Field of the Invention

The present invention relates to semiconductor packages and, more specifically, to semiconductor packages of the stud type.

2Description of the Related Art

FIG. 1 is a fragmentary side view of a conventional stud-type semiconductor package. Referring to FIG. 1, a copper stud 1 is threaded into and fixed to a heat sink portion (not shown) as a heat dissipating member for dissipating heat generated by a semiconductor element (not shown). A ceramic substrate 2 supports the semiconductor element (not shown), and is patterned to connect the wiring of the semiconductor element with thin metal lines (not shown). A neck 3 is provided on the stud 1, and the ceramic substrate 2 is joined to the neck 3 with a brazing material 4 such as an Ag—Cu alloy.

In the conventional semiconductor package having the above-described construction, the neck 3 is made of a material, such as copper, having excellent thermal conductivity, and is formed into an integral structure with the copper stud 1. The ceramic substrate 2 is made of a material such as beryllia or alumina, and is patterned as desired for bonding of the semiconductor element, the metal thin lines, etc.

As stated before, the ceramic substrate 2 is joined to the copper stud 1 by brazing the substrate 2. However, these members greatly differ from each other in their coefficients of thermal expansion. While the coefficient of thermal expansion of the copper stud 1 is $17 \times 10^{-6}/°$ C., that of the ceramic substrate 2 is $7.6 \times 10^{-6}/°$ C. As a result, when, after the brazing, the copper stud 1 and the ceramic substrate 2 are cooled to room temperature, the ceramic substrate 2 is subjected to a large compressive force. The force causes the following problems. Cracks may start from the surface of joint between the substrate 2 and the stud 1. Thermal stress may remain within the ceramic substrate 2 and cause formation of micro-cracks at normal operation temperature. Such micro-cracks can lead to the formation of cracks.

SUMMARY OF THE INVENTION

The present invention has been accomplished in order to prevent the above-described problems. An object of the present invention is to provide a semiconductor package in which the thermal stress due to heating and cooling during the brazing process is suppressed. The package is free from crack formation and exhibits high reliability.

According to the present invention, there is provided a semiconductor package having a ceramic substrate supporting thereon a semiconductor element, the substrate being joined to a heat dissipating member by brazing. The semiconductor package comprises: a first member fixed in place at a position intermediate the ceramic substrate and the heat dissipating member and adjacent to the heat dissipating member, for reducing the thermal stress generated in the ceramic substrate during the brazing; and a second member fixed in place at a position intermediate the first member and the ceramic substrate, for preventing the ceramic substrate from being deformed by thermal stress.

BRIEF DESCRIPTION OF THE DRAWINGS

FIG. 1 is a fragmentary side view of a conventional semiconductor package; and

FIG. 2 is a fragmentary side view of a semiconductor package according to one embodiment of the present invention.

DESCRIPTION OF THE PREFERRED EMBODIMENT

A semiconductor package according to one embodiment of the present invention is shown, in fragmentary side view, in FIG. 2. In this drawing, reference numerals 1 and 2 respectively denote similar component parts as those of the conventional semiconductor package shown in FIG. 1.

A first member, such as a Cu-W alloy 6, is joined to the main body of the copper stud 1 by a brazing material 4a to serve as a neck 5 on the stud 1. The first member 6 reduces the thermal stress, in particular, the compression stress generated in the ceramic substrate 2 during the substrate brazing process. A second member, such as copper foil 7, is fixed in place on the Cu—W alloy 6 by a brazing material 4b. The second member 7 prevents the ceramic substrate 2 from being deformed by thermal stress attributable to a bimetal effect. The ceramic substrate 2 is joined to the copper foil 7 by a brazing material 4c.

In a semiconductor package having the above-described construction, during the heating stage of the brazing process, certain members of the package are heated, and, because of the heating, deformation by thermal stress is not serious even if it does occur. However, when, after the brazing stage, the members are cooled, the bimetal effect takes place. That is, the copper stud 1 and the Cu—W alloy 6 warp as a bimetal does because of the difference in their coefficients of thermal expansion. The warping may lead to formation of cracks in the substrate 2. In order to avoid this problem, that is, to prevent the substrate 2 from being influenced by the deformation of the copper stud 1 and the Cu—W alloy 6, the copper foil 7 is provided as a flexible second member between the Cu—W alloy 6 and the ceramic substrate 2.

In this way, the Cu—W alloy 6, which has a thermal expansion coefficient intermediate those of the main body of the copper stud 1 and the ceramic substrate 2, is used as the neck 5 on the copper stud 1. The provision of the alloy 6 reduces the compressive stress generated in the ceramic substrate 2 in the brazing-cooling profile. Further, the flexible copper foil 7 is interposed between the lower surface of the ceramic substrate 2 and the Cu—W alloy 6 so as to prevent the hard and brittle ceramic substrate 2 from being influenced by the slight deformation due to the bimetal behavior of the copper stud 1 and the Cu—W alloy 6, hence, to prevent crack formation in the substrate 2. The provision of the foil 7 makes it possible to mitigate the influence of the bimetal deformation on the substrate 2.

In the above-described embodiment, the first member having a thermal expansion coefficient intermediate those of the copper stud 1 and the ceramic substrate 2 is made of a Cu—W alloy. However, this is a mere example, and the first member may alternatively be made of other materials such as a Cu—Mo alloy. Also, in the foregoing embodiment, although the flexible second member for preventing deformation of the substrate 2 is made of copper foil, this member may alternatively be made of gold foil or aluminum foil. The semiconductor element in the semiconductor package may suitably be a power transistor, etc.

What is claimed is:

1. A semiconductor package comprising:

a ceramic substrate having a first coefficient of thermal expansion for supporting thereon a semiconductor element;

a heat dissipating member having a second coefficient of thermal expansion;

a first member having a third coefficient of thermal expansion intermediate the first and second coefficients of thermal expansion brazed to said heat dissipating member and disposed intermediate of said ceramic substrate and said heat dissipating member for reducing the thermal stress generated in said ceramic substrate during brazing of said ceramic substrate and said heat dissipating member; and a flexible metal foil brazed to said first member and to said ceramic substrate for preventing said ceramic substrate from being deformed by thermal stress.

2. A semiconductor package according to claim 1 wherein said first member is a Cu—W alloy.

3. A semiconductor package according to claim 1 wherein said first member is a Cu—Mo alloy.

4. A semiconductor package according to claim 1 wherein said flexible metal foil is copper.

5. A semiconductor package according to claim 1 wherein said flexible metal foil is gold.

6. A semiconductor package according to claim 1 wherein said flexible metal foil is aluminum.

7. A semiconductor package according to claim 1 wherein said heat dissipating member is a copper stud.

8. A semiconductor package according to claim 1 wherein said ceramic substrate is beryllia.

9. A semiconductor package according to claim 1 wherein said ceramic substrate is alumina.

10. A semiconductor package according to claim 1 wherein said heat dissipating member is a copper stud and said first member is a copper alloy brazed to said stud.

* * * * *